(12) United States Patent
Lee et al.

(10) Patent No.: US 11,222,580 B2
(45) Date of Patent: Jan. 11, 2022

(54) DISPLAY APPARATUS AND METHOD OF MANUFACTURING DISPLAY APPARATUS

(71) Applicant: SAMSUNG ELECTRONICS CO., LTD., Suwon-si (KR)

(72) Inventors: Keonhak Lee, Suwon-si (KR); Kijune Baek, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 16/440,359

(22) Filed: Jun. 13, 2019

(65) Prior Publication Data
US 2019/0385512 A1 Dec. 19, 2019

(30) Foreign Application Priority Data

Jun. 15, 2018 (KR) .................. 10-2018-0068865

(51) Int. Cl.
*G09G 3/32* (2016.01)
*H01L 27/15* (2006.01)

(52) U.S. Cl.
CPC ............. *G09G 3/32* (2013.01); *H01L 27/156* (2013.01); *G09G 2300/0426* (2013.01); *G09G 2310/08* (2013.01)

(58) Field of Classification Search
CPC .............................................. G09G 3/30–3208
See application file for complete search history.

(56) References Cited

U.S. PATENT DOCUMENTS

| | | | |
|---|---|---|---|
| 2004/0169766 A1* | 9/2004 | Yoshida | H04N 5/23212 348/349 |
| 2008/0122832 A1* | 5/2008 | Chen | G09G 3/32 345/214 |
| 2012/0075271 A1* | 3/2012 | Snijder | G09G 3/2088 345/204 |
| 2016/0078800 A1* | 3/2016 | Ha | G09G 3/32 315/209 R |

FOREIGN PATENT DOCUMENTS

| KR | 10-1783359 B1 | 9/2017 |
|---|---|---|
| KR | 10-2017-0111468 A | 10/2017 |

* cited by examiner

*Primary Examiner* — Hang Lin
(74) *Attorney, Agent, or Firm* — Sughrue Mion, PLLC

(57) ABSTRACT

Provided is a display apparatus including a plurality of light-emitting diode (LED) display modules, wherein each of the plurality of LED display modules includes a plurality of LED pixels; and a controller that controls operation of each of the plurality of LED pixels, wherein each of the plurality of LED pixels is connected to the controller via a different driving signal line, and at least two of the plurality of LED pixels are connected to the controller via a same power line.

7 Claims, 14 Drawing Sheets

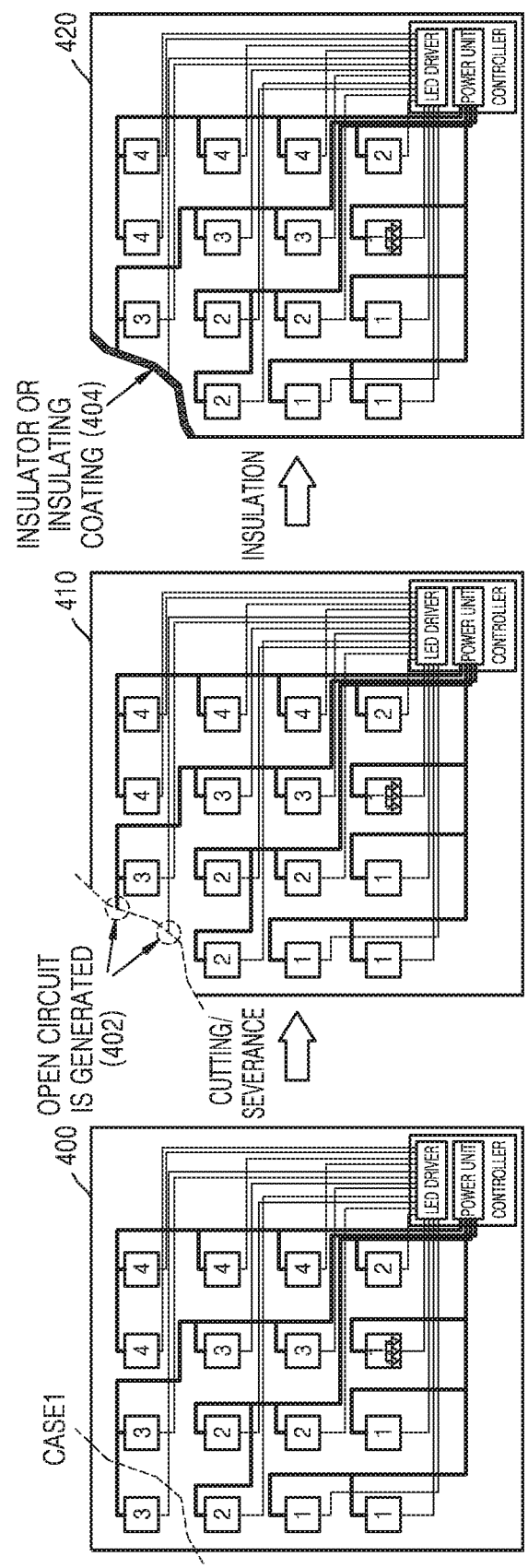

DISPLAY APPARATUS AND METHOD OF MANUFACTURING DISPLAY APPARATUS

CROSS-REFERENCE TO RELATED APPLICATION(S)

This application is based on and claims priority under 35 U.S.C. § 119 to Korean Patent Application No. 10-2018-0068865, filed on Jun. 15, 2018, in the Korean Intellectual Property Office, the disclosure of which is incorporated by reference herein in its entirety.

BACKGROUND

1. Field

The disclosure relates to a display apparatus including a plurality of light-emitting diode (LED) display modules and a method of manufacturing the display apparatus, and more particularly, to a plurality of LED display modules including a plurality of LED pixels and having operational reliability for processing, a display apparatus including the LED display modules, and a method of manufacturing the display apparatus.

2. Description of Related Art

A display apparatus includes a display panel which displays an image, is capable of displaying a broadcast signal, an image signal, or image data in various formats, and is implemented as, for example, a TV, an electronic display, and/or a monitor. With the progress in technology, display apparatuses including various types of display panel have been developed, and recently, a display apparatus including a light-emitting diode (LED) display module has been developed.

An LED display apparatus may be implemented by combining a plurality of LED display modules. An LED display module includes a plurality of LEDs.

An LED display module according to the related art is typically rectangular, has fixed standards and shapes, and is not processable. Thus, implementation of an LED display apparatus by using an LED display module according to the related art has limitations in that a shape of an LED display cannot be implemented as desired. Thus, when an LED display of various shapes is to be manufactured, an LED display module fitting a shape to be manufactured has to be developed each time, and thus mass production of LED displays of various shapes is difficult and the manufacturing costs are also high.

SUMMARY

Additional aspects will be set forth in part in the description which follows and, in part, will be apparent from the description, or may be learned by practice of the embodiments of the disclosure.

According to an embodiment of the disclosure, a display apparatus includes a display including a plurality of light-emitting diode (LED) display modules, wherein each of the plurality of LED display modules includes a plurality of LED pixels; and a controller configured to control operation of each of the plurality of LED pixels, wherein each of the plurality of LED pixels is connected to the controller via a different driving signal line, and at least two of the plurality of LED pixels are connected to the controller via a same power line.

The controller may be located in a central area of each LED display module, and the controller may include: a power unit; and an LED driver, wherein each of the plurality of LED pixels may be connected to the LED driver via the different driving signal line, and the at least two of the plurality of LED pixels may be connected to the power unit via the same power line.

At least one LED display module among the plurality of LED display modules may be cut to be processed into a shape.

At least one LED display module among the plurality of LED display modules may further include either or both of an insulator and an insulating coating.

Each of the plurality of LED display modules may be individually manufactured and combined.

The display may be formed in a shape

According to an embodiment of the disclosure, a method of manufacturing a display apparatus includes a display including a plurality of light-emitting diode (LED) display modules, the method including: receiving form information of the display; determining, based on the form information, processing information including a number of the plurality of LED display modules included in the display, address information of each of the plurality of LED display modules, and shape information of each of the plurality of LED display modules; processing each of the plurality of LED display modules based on the processing information; and forming the display apparatus by assembling the processed plurality of LED display modules, wherein each of the plurality of LED display modules includes: a plurality of LED pixels; and a controller configured to control operation of each of the plurality of LED pixels, and wherein each of the plurality of LED pixels is connected to the controller via a different driving signal line, and at least two of the plurality of LED pixels are connected to the controller via a same power line.

The processing of each of the plurality of LED display modules based on the processing information may include cutting and insulating each of the plurality of LED display modules in accordance with the form information of each of the plurality of LED display modules.

The receiving form information of the display may include receiving any one or any combination of shape information of the display, size information of the display, and pixel pitch information of the display.

According to an embodiment of the disclosure, a display apparatus includes: a display including: a plurality of light-emitting diode (LED) display modules, wherein each of the plurality of LED display modules includes a plurality of LED pixels; and a controller configured to control operation of each of the plurality of LED pixels, wherein each of the plurality of LED pixels is connected to the controller via a different driving signal line, and at least two of the plurality of LED pixels are connected to the controller via a same power line; a memory storing one or more instructions; and at least one processor configured to execute the one or more instructions to: acquire content to be displayed; convert the content based on shape information of each of the plurality of LED display modules; and control the converted content to be displayed on the plurality of LED display modules.

The memory may store address information of each of the plurality of LED display modules and shape information of each of the plurality of LED display modules, and wherein the at least one processor may be further configured to execute the one or more instructions to: convert the content based on the address information of each of the plurality of LED display modules and the shape information of each of the plurality of LED display modules, and display, on the plurality of LED display modules, the content based on the address information of each of the plurality of LED display modules.

The at least one processor may be further configured to execute the one or more instructions to convert the content by using linear transformation may include any one or any combination of rotation, reflection, scaling, shear, projection, cropping, and edge rounding, based on the shape information of each of one or more of the plurality of LED display modules.

BRIEF DESCRIPTION OF THE DRAWINGS

The above and other aspects, features, and advantages of certain embodiments of the disclosure will be more apparent from the following description taken in conjunction with the accompanying drawings, in which:

FIGS. 4A and 4B are diagrams for describing an LED display module including an insulator or an insulating coating, which may be included in a display of a display apparatus including a plurality of LED display modules, according to an embodiment of the disclosure;

DETAILED DESCRIPTION

Figure 1:
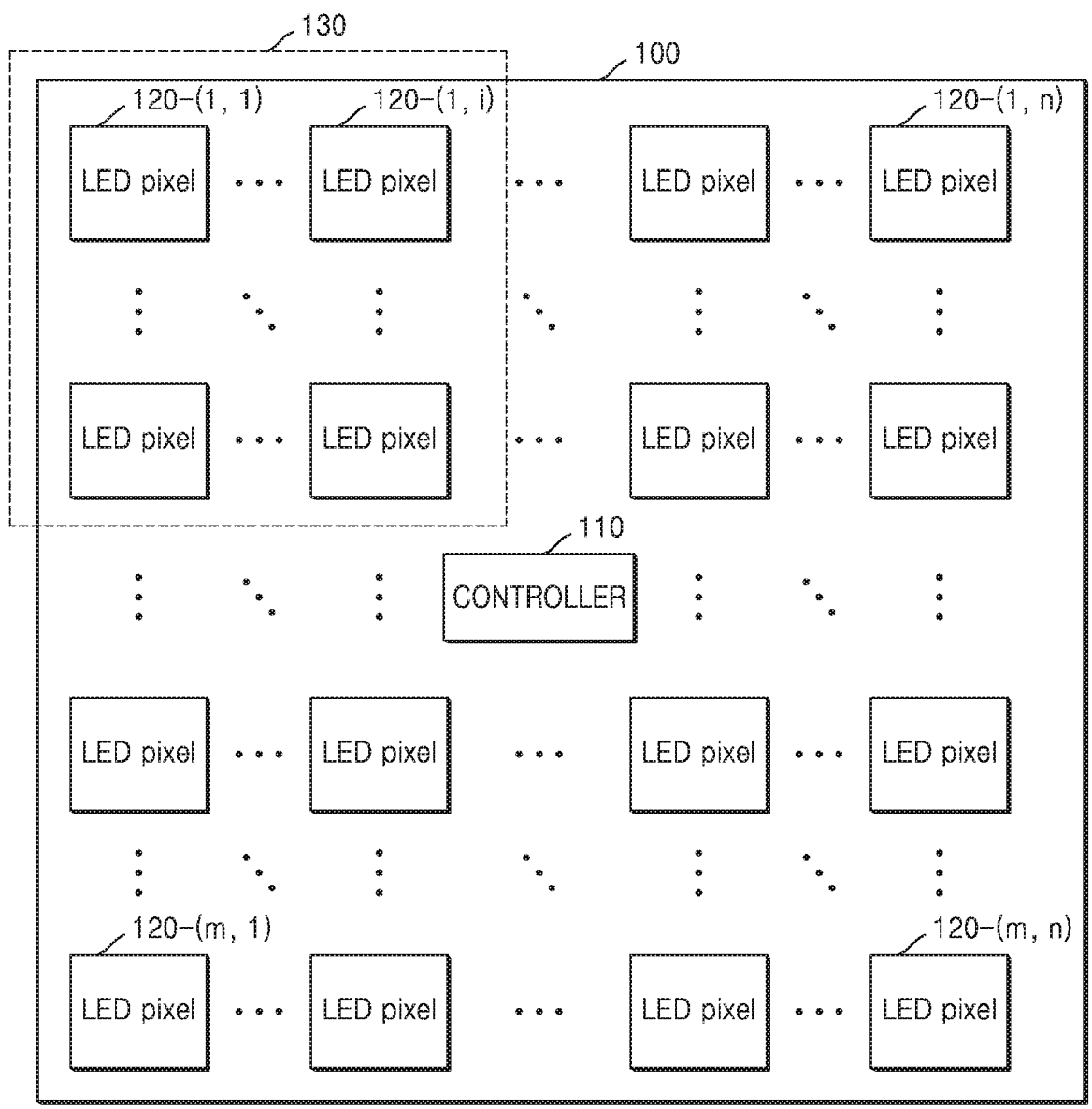
FIG. 1 is a diagram for describing a structure of a light-emitting diode (LED) display module, a plurality of which are included in a display of a display apparatus, according to an embodiment of the disclosure.

Throughout the disclosure, the expression "at least one of a, b or c" indicates only a, only b, only c, both a and b, both a and c, both b and c, all of a, b, and c, or variations thereof.

Hereinafter, the terms used in the specification will be briefly described, and then the disclosure will be described in detail.

The terms used in this specification are those general terms currently widely used in the art in consideration of functions in regard to the disclosure, but the terms may vary according to the intention of those of ordinary skill in the art, precedents, or new technology in the art. Also, specified terms may be selected by the applicant, and in this case, the detailed meaning thereof will be described in the detailed description of the disclosure. Thus, the terms used in the specification should be understood not as simple names but based on the meaning of the terms and the overall description of the disclosure.

Throughout the specification, it will also be understood that when a component "includes" an element, unless there is another opposite description thereto, it should be understood that the component does not exclude another element but may further include another element. In addition, terms such as ". . . unit", ". . . module", or the like refer to units that perform at least one function or operation, and the units may be implemented as hardware or software or as a combination of hardware and software.

It will be understood that, although the terms first, second, etc. may be used herein to describe various elements, these elements should not be limited by these terms These terms are only used to distinguish one element from another. An expression used in the singular encompasses the expression of the plural, unless it has a clearly different meaning in the context.

Hereinafter, the disclosure will now be described more fully with reference to the accompanying drawings, in which embodiments of the disclosure are shown such that one of ordinary skill in the art may easily work the disclosure. This disclosure may, however, be embodied in many different forms and should not be construed as limited to the embodiments set forth herein. Also, elements not related to description are omitted in the drawings for clear description of the disclosure, and like reference numerals in the drawings denote like elements throughout the specification.

In the embodiments of the disclosure of the present specification, the term "user" refers to a person who controls a function or operation of a display apparatus or a person who has ordered the manufacture of a display apparatus, and may include a viewer, an administrator, a display apparatus maker, or an installation technician.

Provided is a plurality of light-emitting diode (LED) display modules that include a plurality of LED pixels and are processable, for example, they may be cut and insulated, while maintaining operational reliability; a display apparatus including the LED display modules; and a method of manufacturing the display apparatus.

FIG. 1 is a diagram for describing a structure of a light-emitting diode (LED) display module 100, wherein a plurality of LED display modules 100 are included in a display of a display apparatus, according to an embodiment of the disclosure.

Referring to FIG. 1, the LED display module 100 according to an embodiment of the disclosure may include a plurality of LED pixels.

An LED pixel may include one or more LEDs. For example, an LED pixel may include three LEDs respectively displaying red (R), green (G), and blue (B) colors. However, this is an example, and the number of LEDs included in an LED pixel is not limited to three. For example, an LED pixel may include four LEDs respectively displaying R, G, B, and white (W) colors, or may include one single LED capable of displaying R, G, B, and W colors. An LED may be, for example, a 5 mm-sized LED, but is not limited thereto, and the size and type of an LED are not limited thereto. For example, an LED may be a micro-LED or an organic LED (OLED).

Referring to FIG. 1, the LED display module 100 may be rectangular, and a plurality of LED pixels included in the LED display module 100 may be arranged in a (m×n) rectangular array form. However, this is an example, and the shape of the LED display module 100 and the number and arrangement of a plurality of LED pixels are not limited to those illustrated in FIG. 1. For example, the LED display module 100 may be parallelogrammic or hexagonal, or a plurality of LED pixels may be arranged in a circle or irregularly.

The LED display module 100 includes a controller 110 controlling operation of each of the plurality of LED pixels. The plurality of LED pixels are respectively connected to the controller 110 via different driving signal lines from each other, and at least some of the plurality of LED pixels are connected to the controller 110 via a same power line. For example, from among the plurality of LED pixels, a first LED pixel 120-(1, 1) and a second LED pixel 120-(1, i) may be connected to the controller 110 in parallel via a same power line. However, this is an example, and connection between the plurality of LED pixels and the controller 110 is not limited to the above-described embodiment of the disclosure. Various methods to connect the plurality of LED pixels to the controller 110 will be described in detail with reference to FIG. 2.

Referring to FIG. 1, the controller 110 is located in a central area of the LED display module 100 corresponding to the controller 110. However, this is an example, and a position of the controller 110 in the LED display module 100 is not limited to a central area of the LED display module 100. For example, the controller 110 may be located at an edge of the LED display module 100 corresponding to the controller 110. In addition, the number of the controller 110 included in the LED display module 100 is not limited to one. For example, the LED display module 100 may be divided into a plurality of regions, and a controller may be included in each region. For example, referring to FIG. 1, a controller corresponding to a partial region 130 may be located in the partial region 130.

Figure 2:
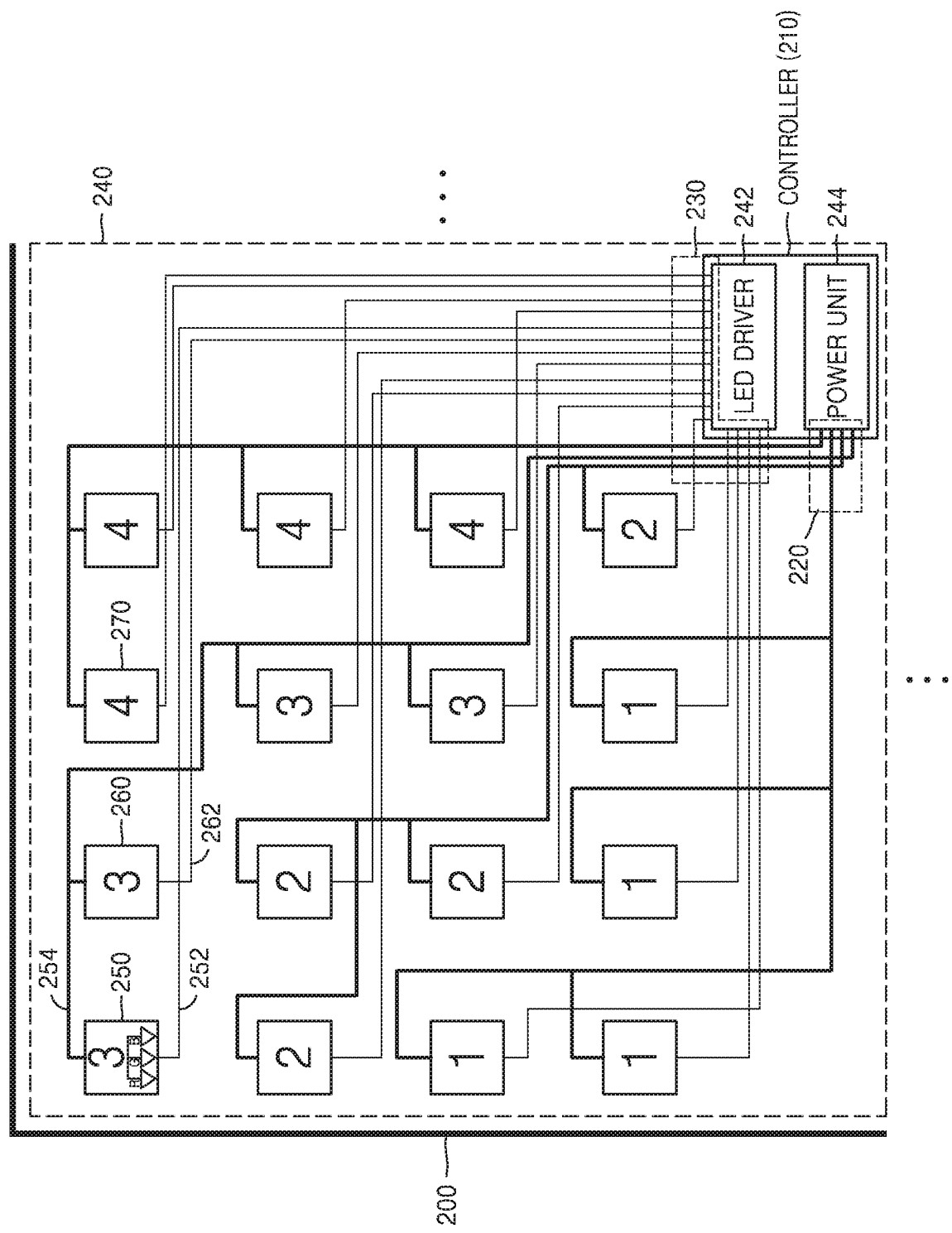
FIG. 2 is a diagram for describing a structure of an LED display module, a plurality of which are included in a display of a display apparatus, according to an embodiment of the disclosure.

FIG. 2 is a diagram for describing a structure of an LED display module 200, wherein a plurality of the LED display modules are included in a display of a display apparatus, according to an embodiment of the disclosure.

Referring to FIG. 2, a structure of the LED display module 200 according to an embodiment of the disclosure is illustrated. A broken line portion 240 of the LED display module 200 may be the partial region 130 at an upper left end of the LED display module 100 illustrated in FIG. 1.

The LED display module 200 may further include a plurality of other LED pixels in addition to those in the broken line portion 240, and a controller 210 may be located in a central area of the LED display module 200. While sixteen LED pixels arranged in a (4×4) array are included in the broken line portion 240 of the LED display module 200 in FIG. 2, this is an example, and the number and arrangement of LED pixels included in the broken line portion 240 are not limited to the above-described embodiment of the disclosure. In addition, the LED display module 200 may further include another controller in addition to the controller 210 illustrated in FIG. 2, and in this case, the controller 210 may control only the LED pixels included in the broken line portion 240.

Referring to FIG. 2, the plurality of LED pixels may be connected to the controller 210 via different driving signal lines 230 from each other. For example, a first LED pixel 250 may be connected to the controller 210 via a first driving signal line 252, and a second LED pixel 260 may be connected to the controller 210 via a second driving signal line 262.

At least some of a plurality of LED pixels are connected to the controller 210 via a same power line. For example, the first LED pixel 250 and the second LED pixel 260 from among the plurality of LED pixels are connected to the controller 210 in parallel via a same power line, here, a power line 254. However, the above-described embodiment of the disclosure is merely an embodiment, and three or more LED pixels may also be connected to the controller 210 via a same power line. For example, as illustrated in FIG. 2, four LED pixels labeled with a same reference numeral may be respectively connected to the controller 210 via a same power line. In addition, the plurality of LED pixels may be connected to the controller 210 via different power lines from each other. When the plurality of LED pixels are respectively connected to the controller 210 via different power lines, a connection structure between the plurality of LED pixels and the controller 210 is a star topology structure.

According to the structure of the LED display module 200 of an embodiment of the disclosure, operational reliability of the LED display module 200 may be ensured.

For example, according to a structure of a LED display module of the related art, when a driving signal line is damaged in the LED display module, due to, for example, cutting, connection between a controller and LED pixels connected to the damaged driving signal line is disconnected, disabling driving of the LED pixels described above. However, according to an embodiment of the disclosure, as a plurality of LED pixels are respectively connected to the controller 210 via different driving signal lines from each other, connection between the controller 210 and LED pixels connected to other undamaged driving signal lines may be maintained, and driving of the LED pixels described above may be maintained. Accordingly, even when the LED display module 200 is cut or processed into a desired shape by using another method, operational reliability of the LED display module 200 may be ensured.

In addition, according to an embodiment of the disclosure, some of the plurality of LED pixels may be connected to the controller 210 via a same power line, thus reducing wiring complexity of the LED display module 200.

The controller 210 included in the LED display module 200 according to an embodiment of the disclosure controls operation of the plurality of LED pixels.

For example, the controller 210 may transmit, to the plurality of LED pixels, a data signal corresponding to addresses of the plurality of LED pixels, via the driving signal lines 230. LEDs included in the plurality of LED pixels may be respectively driven according to data signals respectively received by the plurality of LED pixels.

In addition, the controller 210 may supply power received from an internal power supply of the LED display module 200 or an external power supply, to the plurality of LED pixels via different power lines 220. For example, the controller 210 may supply power to the first LED pixel 250 and the second LED pixel 260 via a same power line 254. As illustrated in FIG. 2, for example, the controller 210 may supply power to four LED pixels labeled the same number, via a same power line.

In addition, according to an embodiment of the disclosure, the controller 210 may supply power to the plurality of LED pixels based on control information decoded to correspond to addresses of the plurality of LED pixels. For example, based on the control information described above, the controller 210 may supply power to the first LED pixel 250, and may not supply power to a third LED pixel 270.

The controller 210 according to an embodiment of the disclosure may include a LED driver 242 and a power unit 244. According to an embodiment of the disclosure, the plurality of LED pixels may be respectively connected to the LED driver 242 via different driving signal lines 230 from each other. In addition, at least some of the plurality of LED pixels, for example, the first LED pixel 250 and the second LED pixel 260, may be connected to the power unit 244 via a same power line 254. A structure of the controller 210 will be described in detail with reference to FIG. 3.

In the LED display module 200 according to an embodiment of the disclosure illustrated in FIG. 2, an example of an arrangement of the plurality of LED pixels and an example of wiring between the plurality of LED pixels and the controller 210 are illustrated, and the arrangement and the wiring structure are not limited thereto. For example, the plurality of LED pixels may be arranged irregularly, instead of an array arrangement, and the plurality of LED pixels may be respectively connected to the controller 210 via different power lines from each other.

The broken line portion 240 of the LED display module 200 may be the partial region 130 at the upper left end of the LED display module 100 illustrated in FIG. 1, but this is an example, and the broken line portion 240 illustrated in FIG. 2 may also one LED display module 200. In this case, referring to FIG. 2, the controller 210 is located at a lower right end of the LED display module 200.

Figure 3:
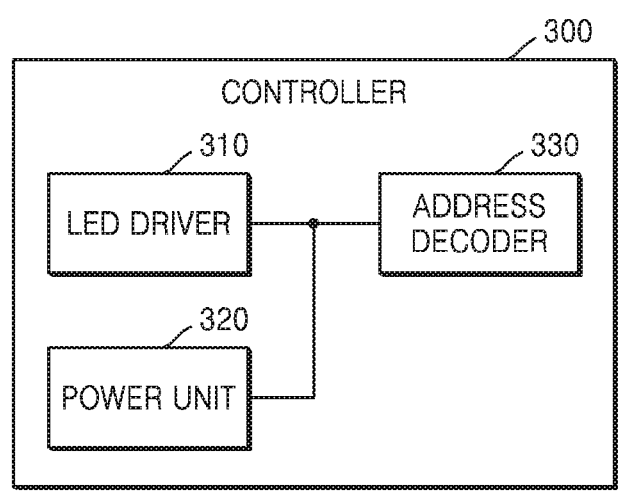
FIG. 3 is a diagram for describing a structure of a controller included in an LED display module, a plurality of which are included in a display of a display apparatus, according to an embodiment of the disclosure.

FIG. 3 is a diagram for describing a structure of an LED display module, a plurality of which are included in a display of a display apparatus, according to an embodiment of the disclosure.

A controller 300 included in the LED display module according to an embodiment of the disclosure may include a LED driver 310 and a power unit 320.

The LED driver 310 may transmit a data signal corresponding to respective addresses of the plurality of LED pixels, to each of the plurality of LED pixels included in the LED display module, via a driving signal line. LEDs included in the plurality of LED pixels may be respectively driven according to data signals respectively received by the plurality of LED pixels.

The power unit 320 may supply power that is received from an internal power supply of the LED display module or an external power supply, to the plurality of LED pixels, via different power lines from each other. The power unit 320 may include at least one power source. Alternatively, the power unit 320 may be the at least one power source. According to an embodiment of the disclosure, the controller 300 may supply power to at least some of the plurality of LED pixels via a same power line. In addition, according to an embodiment of the disclosure, the controller 300 may supply power to the plurality of LED pixels based on control information decoded to correspond to the plurality of LED pixels. For example, based on the control information described above, the controller 300 may supply power to a first LED pixel, and may not supply power to a third LED pixel.

The controller 300 may also include an address decoder 330. The address decoder 330 may receive an address signal from the outside, and may output a signal that directs to selectively transmit a control signal only to an LED pixel having the received address.

According to an embodiment of the disclosure, the address decoder 330 may transmit an output signal to the LED driver 310, and the LED driver 310 may transmit a data signal corresponding to respective addresses of a plurality of LED pixels to the plurality of LED pixels included in the LED display module according to the output signal received. In addition, according to an embodiment of the disclosure, the address decoder 330 may transmit an output signal to the power unit 320, and the power unit 320 may selectively supply power to the plurality of LED pixels according to the received output signal, in accordance with respective addresses of the plurality of LED pixels.

Figure 4B:
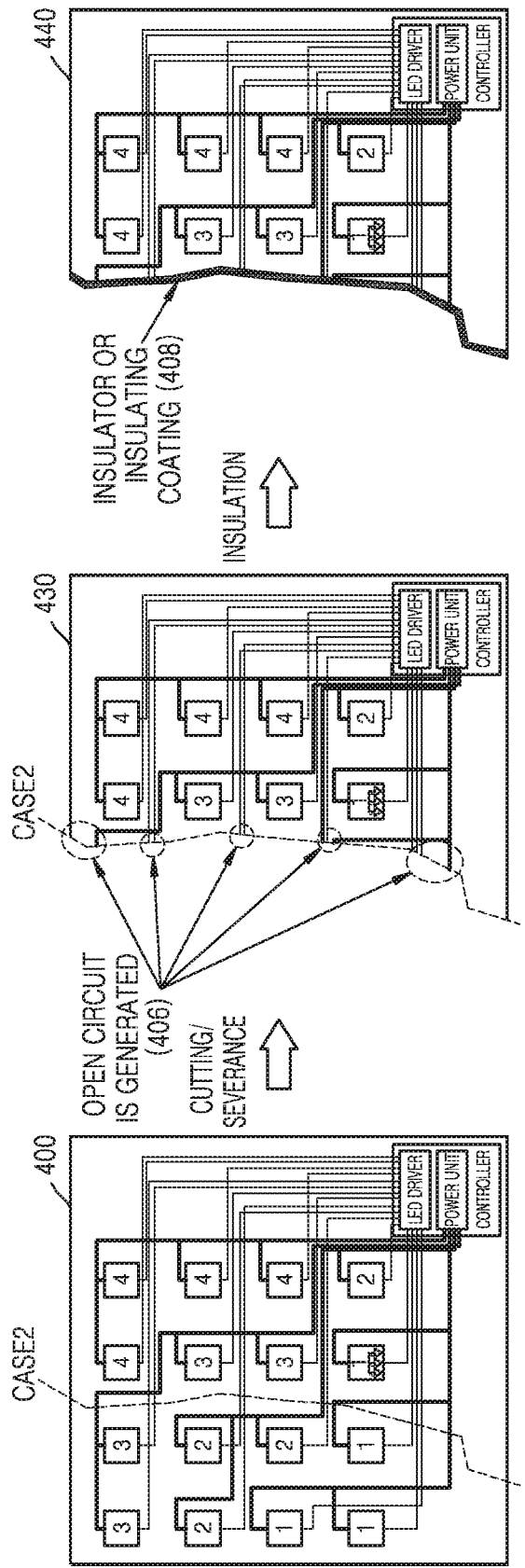

FIGS. 4A and 4B are diagrams for describing an LED display module including an insulator or an insulating coating each for insulation, which may be included in a display of a display apparatus including a plurality of LED display modules, according to an embodiment of the disclosure.

Referring to FIGS. 4A and 4B, as described with reference to FIG. 2, when a portion of the LED display module 400 according to an embodiment is cut or severed, driving of LED pixels included in the remaining area of the LED display module 400 may be maintained. When the LED display module 400 is cut, an open circuit may be formed in a driving signal line or a power line adjacent to the cut portion thereof. Thus, to ensure driving of the LED display module 400, the cut portion of the LED display module 400 may have to be insulated to protect the LED display module 400 from external impact and contact and block a circuit short.

Referring to FIG. 4A, an open circuit 402 is generated when the LED display module 400 is cut as in CASE 1. Thus, LED pixels connected to a line in a LED display module 410 where the open circuit 402 is generated may not operate. Accordingly, by insulating edges of near the cut portion of the LED display module 400, an LED display module 420 including an insulator or an insulating coating 404 may be generated to thereby ensure normal driving of the LED display module 420. Referring to FIG. 4B, when the LED display module 400 is cut as in CASE 2, an open circuit 406 is generated in more portions than CASE 1, as illustrated in LED display module 430.

According to the above-described embodiment of the disclosure, at least some of the plurality of LED display modules included in a display apparatus may have a cut form to be processed in an arbitrary form. In addition, at least some of the plurality of LED display modules may have an arbitrary form. In addition, a display apparatus including a display including a plurality of LED display modules may have an arbitrary form. In addition, the plurality of LED display modules may be respectively individually manufactured and then combined.

According to the above-described embodiment of the disclosure, in the LED display modules 420 and 440 including the insulator or the insulating coating 404 and 408 respectively, although the LED display modules 420 and 440 are cut, LED pixels remaining in the LED display modules 420 and 440 may be driven normally. Accordingly, the LED display modules 420 and 440 according to an embodiment of the disclosure are versatile irrespective of a shape of the entire display to be assembled using the LED display modules 420 and 440.

Figure 5:
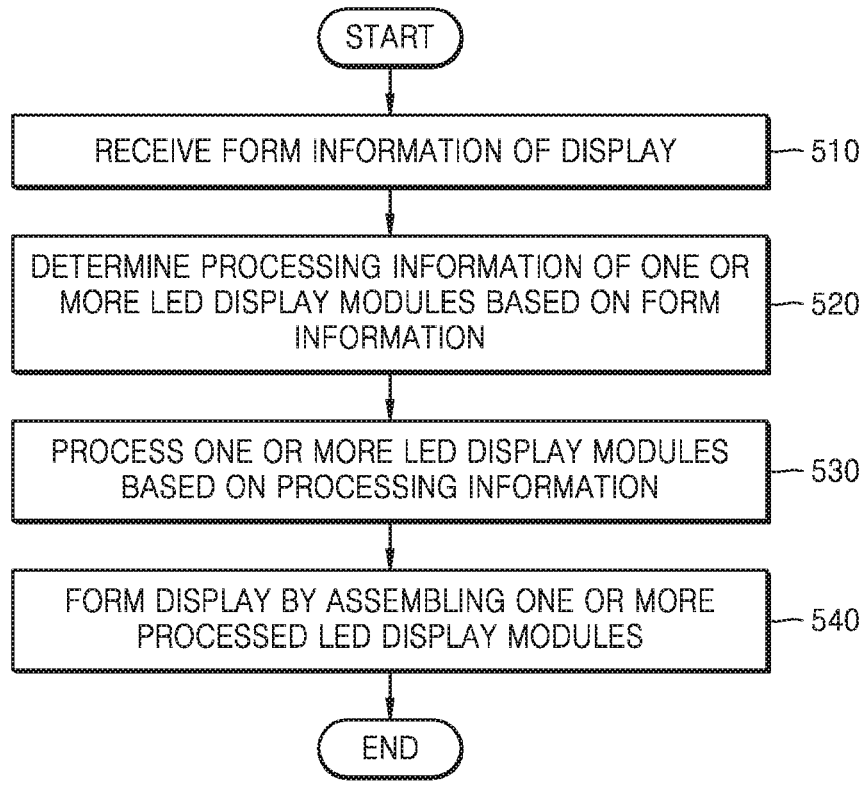
FIG. 5 is a flowchart of a method of manufacturing a display apparatus including a display including a plurality of LED display modules, according to an embodiment of the disclosure.

FIG. 5 is a flowchart of a method of manufacturing a display apparatus including a display including a plurality of LED display modules, according to an embodiment of the disclosure.

A plurality of LED display modules included in a display of a display apparatus according to an embodiment of the disclosure may include a plurality of LED pixels and a controller controlling operation of each of the plurality of LED pixels, and the plurality of LED pixels are connected to the controller via different driving signal lines from each other, and at least some of the plurality of LED pixels are connected to the controller in parallel via a same power line. However, this is an example, and the structure and wiring structure of the LED display module are not limited to the above-described embodiment of the disclosure. Detailed descriptions of the embodiments of the LED display module of the disclosure are provided above with reference to FIGS. 1 through 4, and thus will be omitted here.

Referring to FIG. 5, first, a receiver receives form information of a display of a display apparatus to be manufactured (operation 510). This operation will be described in more detail with reference to FIG. 6.

Next, a control device determines processing information including the number of plurality of LED display modules included in the display apparatus, address information of the plurality of LED display modules, and shape information of the plurality of LED display modules (operation 520).

Next, a processing apparatus processes the plurality of LED display modules based on the processing information (operation 530). Operations 520 and 530 will be described in detail with reference to FIG. 7.

Finally, an assembly device assembles the processed plurality of LED display modules to complete the manufacture of the display apparatus (operation 540).

Figure 6:
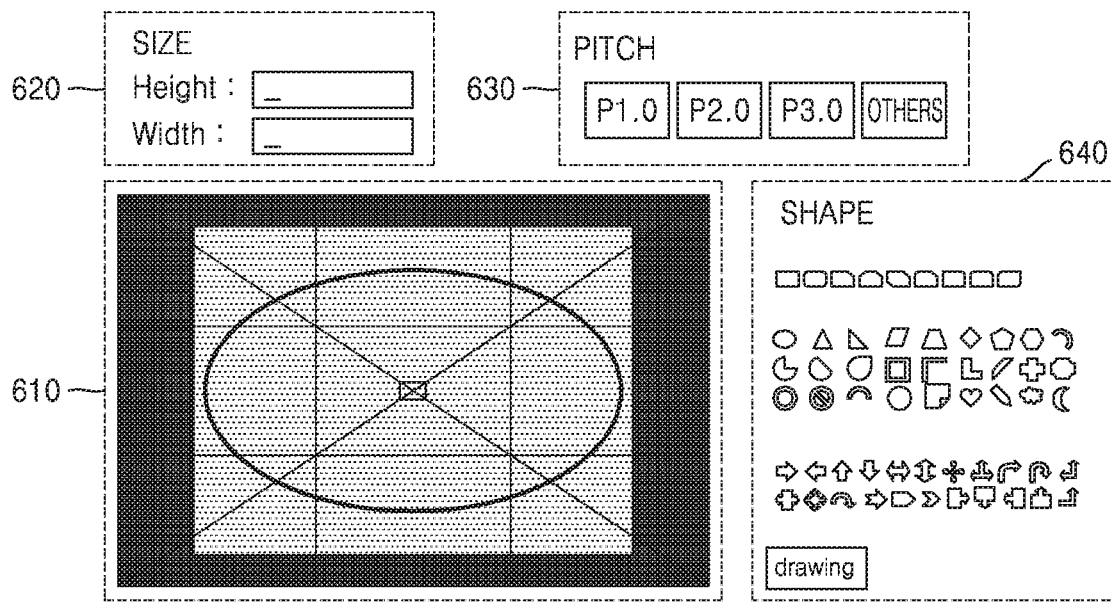
FIG. 6 is a diagram for describing a method of receiving form information of a display including one or more LED display modules, according to an embodiment of the disclosure.

FIG. 6 is a diagram for describing a method of receiving form information of a display of a display apparatus including one or more LED display modules, according to an embodiment of the disclosure.

The receiver according to an embodiment of the disclosure may be implemented using various electronic devices such as a computer, e.g., a personal computer (PC), a laptop computer, a tablet PC, a mobile phone, or a smartphone, but is not limited thereto.

The shape of the display apparatus according to an embodiment of the disclosure may be various. For example, the display apparatus may be a diamond shape, a semicircular shape, or a trapezoidal shape, and is not limited to be above-described embodiment of the disclosure, and may have an arbitrary shape.

Referring to FIG. 6, the receiving, by the receiver according to an embodiment of the disclosure, of form information of the display may include receiving at least one of shape information of the display, size information of the display, or pixel pitch information of the display. The receiver according to an embodiment of the disclosure may receive display shape information by receiving a selection regarding any one of various preset shapes (640), or by receiving a shape drawn by a user (610). According to an embodiment of the disclosure, a receiver may receive size information 620 of a display by receiving an input about a height and width of a display apparatus. In addition, according to an embodiment of the disclosure, a receiver may receive pixel pitch information of a display by receiving a selection regarding any one of various preset pixel pitches 630 or by receiving a user input regarding a pixel pitch.

According to an embodiment of the disclosure, the receiver may receive form information of a display via a user interface (UI) configured to receive form information of the display apparatus (610 through 640). In addition, according to an embodiment of the disclosure, the receiver may receive form information of a display that is selected or drawn by a user via an online network such as a website. However, the method of receiving form information of a display is not limited to the above-described embodiment of the disclosure, and may be various.

Figure 7:
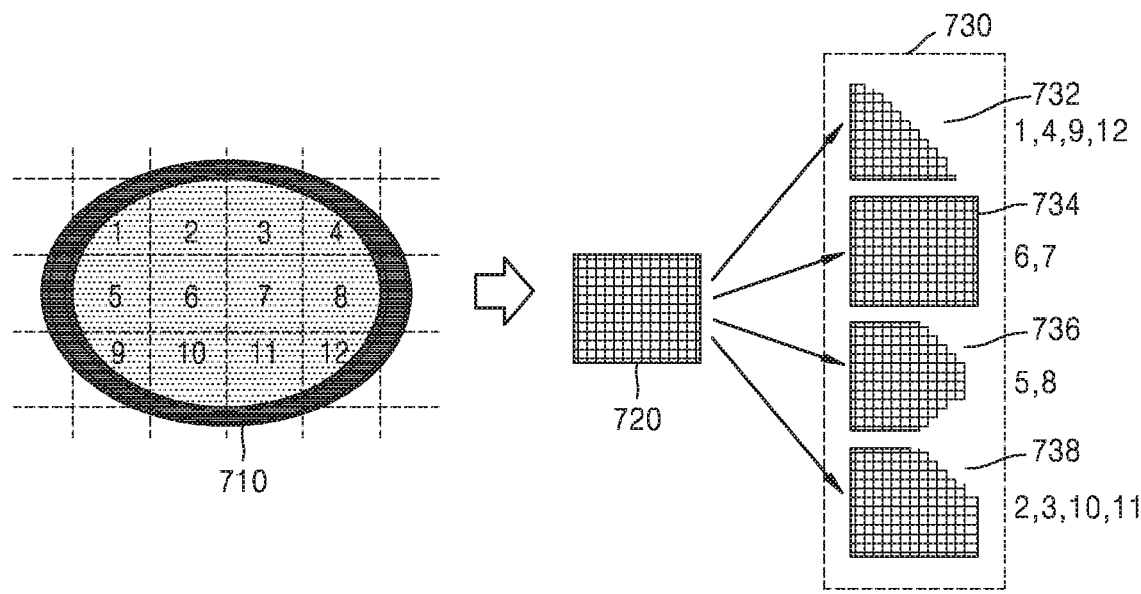
FIG. 7 is a diagram for describing a method of determining processing information of a plurality of LED display modules based on form information of a display, according to an embodiment of the disclosure.

FIG. 7 is a diagram for describing a method of determining processing information of a plurality of LED display modules based on form information of a display of a display apparatus, according to an embodiment of the disclosure.

The control device according to an embodiment of the disclosure may be implemented using various electronic devices such as a computer, e.g., a PC, a laptop computer, a tablet PC, a mobile phone, or a smartphone, but is not limited thereto.

According to an embodiment of the disclosure, a receiver and a control device may be a single device. Also, according to an embodiment of the disclosure, a control device may be a processor included in a receiver. Also, a receiver and a control device may be separate devices from each other. When a receiver and a control device are separate devices, the control device may receive form information of a display from the receiver through a wired or wireless network.

According to the method of manufacturing a display apparatus according to an embodiment of the disclosure, a control device determines, based on form information of the display of the display apparatus, processing information including information about the number of a plurality of LED display modules included in the display apparatus, address information of the plurality of LED display modules, and shape information of the plurality of LED display modules.

Referring to FIG. 7, the control device may generate layout information for generating a received shape 710 of a display (or, a display apparatus) by assembling the plurality of LED display modules, based on the received form information of the display. For example, the control device may generate grid-shaped layout information based on a shape 720 of an LED display module to be used in assembling the LED display modules. However, the method of generating layout information by the control device is not limited to the above-described embodiment of the disclosure. For example, the control device may also generate layout information in units of a triangle or a hexagon based on a shape of an LED display module to be used in the assembly.

Next, based on the layout information, the control device determines the number of LED display modules needed to generate the received shape 710 of the display apparatus. FIG. 7 illustrates an example where the control device determined that twelve LED display modules are needed. In addition, the control device determines address information and shape information of the plurality of LED display modules (730). Referring to 730 of FIG. 7, for example, the control device may determine a shape 732 that is cut almost by half, as a shape of an LED display module at addresses 1, 4, 9, and 12, a shape 734 that is uncut, as a shape of an LED display module at addresses 6 and 7, a shape 736 in which left and right upper ends are cut, as a shape of an LED display module at addresses 5 and 8, and a shape 738 in which a right upper end is cut, as a shape of an LED display module at addresses 2, 3, 10, and 11.

Next, a processing apparatus processes the plurality of LED display modules based on the processing information.

The processing apparatus according to an embodiment of the disclosure may be implemented using various apparatuses such as a cutter, a laser cutter, a wheel cutter, an insulation coater, an epoxy coater, and an apparatus including a cutter and an insulation coater, but is not limited thereto.

According to an embodiment of the disclosure, the processing apparatus may cut and insulate each of the plurality of LED display modules to correspond to the shape information of each of the plurality of LED display modules. The need for and effect of insulation is described in detail above with reference to FIGS. 4A and 4B. A method by which the processing apparatus cuts the LED display modules may be, for example, laser cutting or wheel cutting, but is not limited thereto. The method by which the processing apparatus insulates the LED display modules may be, for example, an epoxy coating or other insulating coating method, but is not limited thereto.

Figure 8:
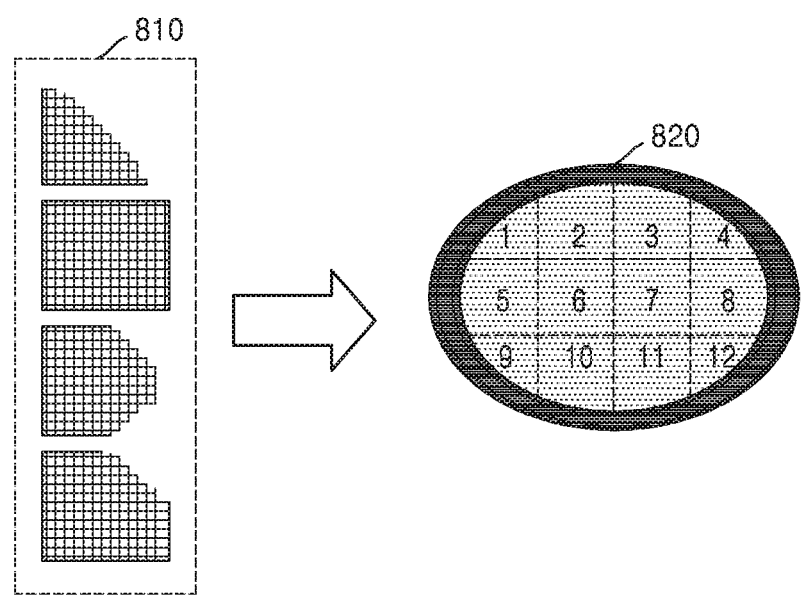
FIG. 8 is a diagram for describing a method of manufacturing a display apparatus by assembling a plurality of LED display modules that are processed, according to an embodiment of the disclosure.

FIG. 8 is a diagram for describing a method of manufacturing a display apparatus by assembling a plurality of LED display modules that are processed, by using an assembling apparatus, according to an embodiment of the disclosure.

The assembling apparatus according to an embodiment of the disclosure may be implemented using various apparatuses such as a typical LED assembling apparatus, an automated assembly machine, and the like, but is not limited thereto.

Referring to FIG. 8, the assembling apparatus may generate a display of a display apparatus 820 by assembling a plurality of processed LED display modules 810 based on addresses of the plurality of processed LED display modules 810. The assembling apparatus may generate the display apparatus 820 using the generated display. A method of assembling the plurality of processed LED display modules 810 by using the assembling apparatus may be various, and is not limited to any one method.

The display apparatus 820 generated according to an embodiment of the disclosure may be applied to various products. For example, the display apparatus 820 may be applied to a TV, an electronic display, or a monitor, which, however, are examples, and application of the display apparatus 820 is not limited to the above.

Figure 9:
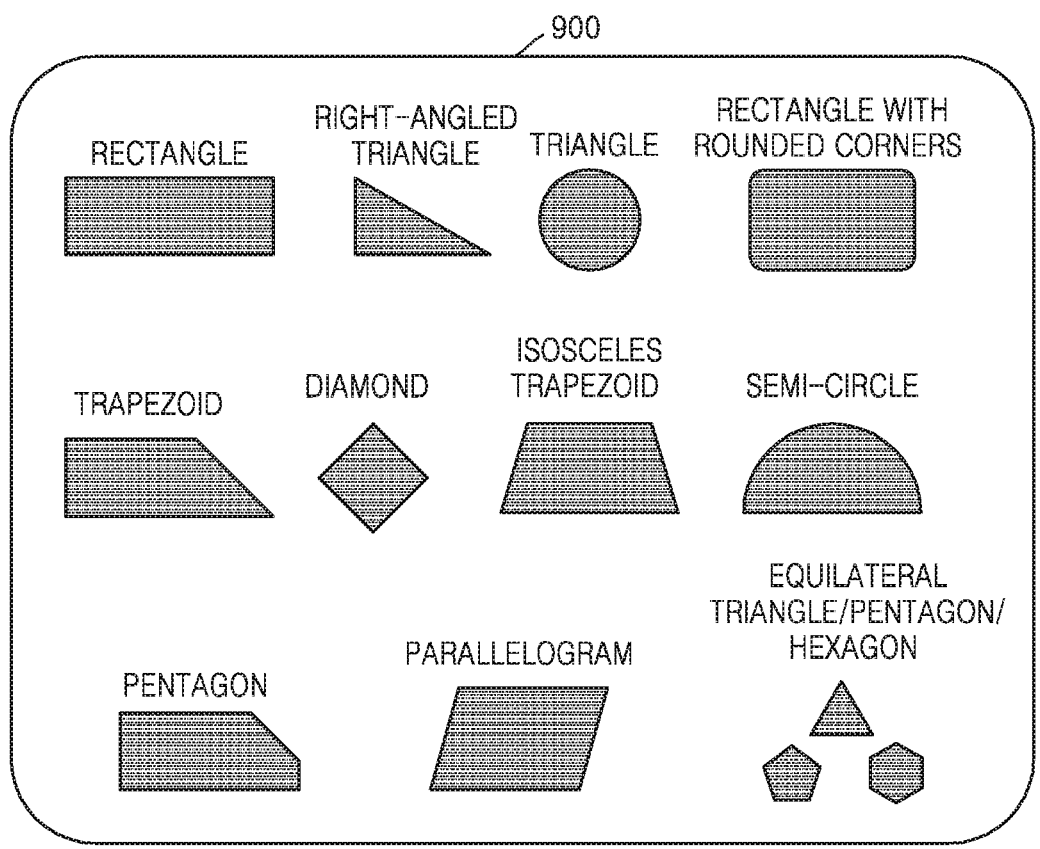
FIG. 9 is a diagram for describing various available shapes of a display of display apparatus including one or more LED display modules, according to an embodiment of the disclosure.

FIG. 9 is a diagram for describing various available shapes of a display of a display apparatus including one or more LED display modules (900), according to an embodiment of the disclosure.

Referring to FIG. 9, as an LED display module according to an embodiment of the disclosure may be processed into any shape, a display including a plurality of LED display modules may have various shapes. For example, the shape of a display may be a semicircle, a diamond, a hexagon or a pentagon, and is not limited to the shapes described above.

According to an embodiment of the disclosure, after a display having a particular shape and including a plurality of LED display modules is generated, the display may be processed again into another shape. For example, a display of a new shape may be generated by disassembling the generated display to obtain the plurality of LED display modules included in the display, and repeating operations 510 to 540 of FIG. 5. In addition, for example, without disassembling the generated display apparatus, a receiver may receive form information of a desired display, and the processing apparatus may determine processing information of the display based on the form information and process the display based on the processing information to generate a display having a new shape.

Figure 10:
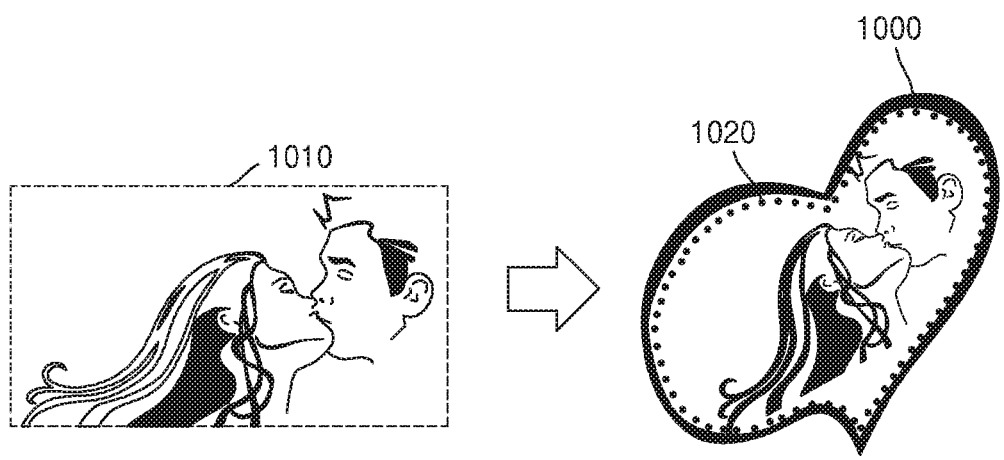
FIG. 10 is a diagram for describing an operation of a display apparatus converting and displaying content, according to an embodiment of the disclosure.

FIG. 10 is a diagram for describing an operation of a display apparatus converting and displaying content, according to an embodiment of the disclosure.

The display apparatus according to an embodiment of the disclosure includes a display 1000 including a plurality of LED display modules. The shape of the display 1000 may be another particular shape different from a typical rectangular shape, and may be, for example, a heart shape as illustrated in FIG. 10. A particular shape of the display 1000 may be a result of processing and assembling the plurality of LED display modules included in the display 1000 according to the manufacturing method described with reference to FIGS. 5 through 9.

For example, as illustrated in FIG. 10, original shape of content 1010 input to the display apparatus may be different from shape of the display 1000 of the display apparatus. In this case, the display apparatus according to an embodiment of the disclosure may convert and display the original content 1010 to correspond to the display 1000 of the display apparatus. Content 1020 obtained by converting the original content 1010 may be displayed according to the shape of the display 1000.

Figure 11:
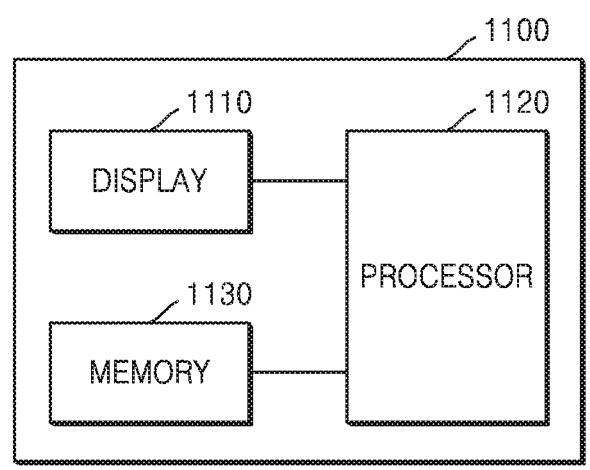
FIG. 11 is a structural diagram of a display apparatus converting and displaying content, according to an embodiment of the disclosure.

FIG. 11 is a structural diagram of a display apparatus converting and displaying content, according to an embodiment of the disclosure.

Referring to FIG. 11, the display apparatus 1100 according to an embodiment of the disclosure may include a display 1110 including a plurality of LED display modules, a memory 1130 storing one or more instructions, and a processor 1120 executing one or more instructions stored in the memory 1130.

The display 1110 according to an embodiment of the disclosure may generate a driving signal by converting, for example, an image signal, a data signal, an on-screen display (OSD) signal, or a control signal that are processed using a processor 1120. The display 1110 may include a plurality of LED display modules, which control LED pixels included in each module to display an image signal or content. The plurality of LED display modules included in the display 1110 may include a plurality of LED display modules and a controller controlling operation of each of the plurality of LED pixels, and the plurality of LED pixels are respectively connected to the controller via different driving signal lines from each other, and at least some of the plurality of LED pixels are connected to the controller in parallel via a same power line. However, this is an embodiment of the disclosure, and the structure and wiring arrangement of the LED display modules are not limited to the above-described embodiment of the disclosure, and for descriptions of the embodiments of the LED display modules, the descriptions of the embodiments described with reference to FIGS. 1 through 4 may be referred to.

The memory 1130 according to an embodiment of the disclosure may store programs (one or more instructions) for processing and controlling the processor 1120, and the number of plurality of LED display modules included in the display 1110, address information of each LED display module, and shape information of each LED display module may be stored in the memory 1130. According to an embodiment of the disclosure, the display 1110 may be a display generated using the manufacturing method described with reference to FIGS. 5 through 9. The address information of each LED display module and the shape information of each LED display module described above may be determined in an operation of determining processing information of each LED display module described with reference to FIG. 7.

The memory 1130 may store various types of data, programs or applications used to drive and control the display apparatus 1100 according to the control by the processor 1120. A program (one or more instructions) or an application stored in the memory 1130 may be executed using the processor 1120. The memory 1130 may include a broadcast receiving module, a channel control module, a volume control module, a communication control module, a voice recognition module, a motion recognition module, a light receiving module, a display control module, an audio control module, an external input control module, a power control module, a power control module of an external device that is wirelessly connected (e.g., Bluetooth), a voice database (DB) or a motion DB. Modules and databases of the memory 1130 may be implemented in the display apparatus 1100 in the form of software to perform a control function of broadcasting reception, a channel control function, a volume control function, a communication control function, a voice recognition function, a motion recognition function, a display control function, an audio control function, an external input control function, a power control function or a power control function of an external device that is wirelessly connected (e.g., Bluetooth). In addition, the memory 1130 may store software that converts content, according to an embodiment of the disclosure. The processor 1120 may perform respective functions by using the software stored in the memory 1130.

The memory 1130 may include at least one type of storage medium selected from a flash memory type storage medium, a hard disk type storage medium, a multimedia card micro type storage medium, a card type memory (e.g., SD or XD memory), a RAM, a static random access memory (SRAM), a read-only memory (ROM), an electrically erasable programmable read-only memory (EEPROM), a programmable read-only memory (PROM), a magnetic memory, a magnetic disc, or an optical disc.

The processor 1120 according to an embodiment of the disclosure may execute one or more programs (one or more instructions) stored in the memory 1130, and the processor 1120 may be a single-core processor, a dual-core processor, a triple-core processor, a quad-core processor, or a multi-core processor including multiple cores thereof. In addition, the processor 1120 may be one processor or may also include two or more processors.

By executing one or more instructions, the processor 1120 may obtain content to be displayed, convert the content based on shape information of the plurality of LED display modules, and display the converted content on the plurality of LED display modules. The processor 1120 according to an embodiment of the disclosure may convert content based on address information of the plurality of LED display modules and shape information of the plurality of LED display modules, and may control display of the converted content on the plurality of LED display modules, based on the address information of the plurality of LED display modules.

The processor 1120 according to an embodiment of the disclosure may convert content to have a shape corresponding to a shape of the display 1110 by using linear transformation including at least one of rotation, reflection, scaling, shear, projection, cropping, or edge rounding, based on the shape information of the plurality of LED display modules. An example of the original content 1010 and the content 1020 obtained by conversion is illustrated in FIG. 10.

Figure 12:
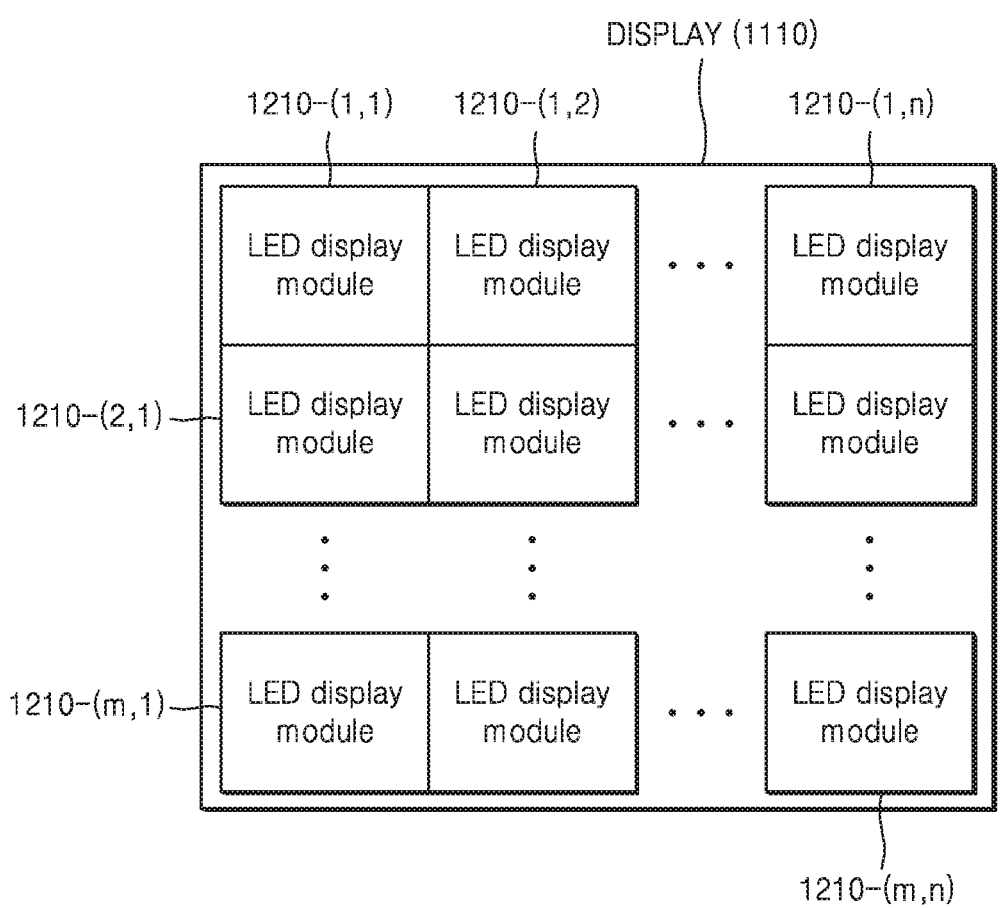
FIG. 12 illustrates an example of a structure of a display, according to an embodiment of the disclosure.

FIG. 12 illustrates an example of a structure of a display 1110, according to an embodiment of the disclosure.

Referring to FIG. 12, the display 1110 according to an embodiment of the disclosure may include a plurality of LED display modules 1210-(1, 1) through 1210-($m$, $n$). Each of the plurality of LED display modules 1210-(1, 1) through 1210-($m$, $n$) is connected to the processor 1120 of the display apparatus 1100 and displays content according to the control by the processor 1120.

Figure 13:
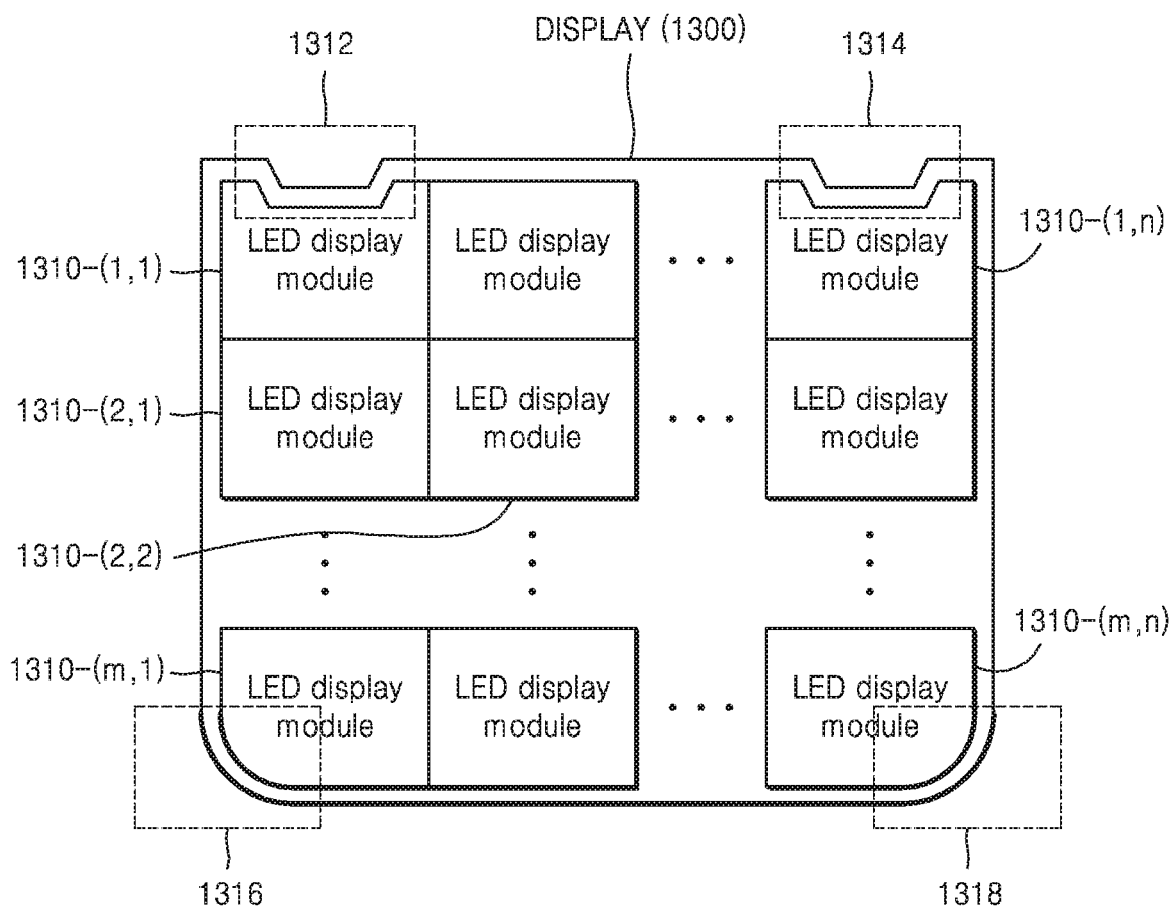
FIG. 13 illustrates another example of a display included in a display apparatus, according to an embodiment of the disclosure.

FIG. 13 illustrates another example of a display included in a display apparatus, according to an embodiment of the disclosure.

Referring to FIG. 13, a display 1300 according to an embodiment of the disclosure may include a plurality of LED display modules 1310-(1, 1) through 1310-($m$, $n$). Each of the plurality of LED display modules 1310-(1, 1) through 1310-($m$, $n$) is connected to the processor 1120 of the display apparatus 1100 and displays content according to the control by the processor 1120. Differently from the display 1110 of FIG. 12, the display 1300 of FIG. 13 includes LED display modules 1310-(1, 1), 1310-(1, $n$), 1310-($m$, 1), and 1310-($m$, $n$) which are not rectangular and include at least one of an insulator or an insulating coating. Thus, the display 1300 according to an embodiment of the disclosure is not rectangular, but has corners 1312, 1314, 1316, and 1318 that have a particular form. The LED display modules 1310-(1, 1), 1310-(1, $n$), 1310-($m$, 1), and 1310-($m$, $n$) may be display modules in which cutting and insulation are performed according to the method described with reference to FIGS. 4A, 4B and 7, and may normally operate according to the wiring structure described with reference to FIG. 2.

Figure 14:
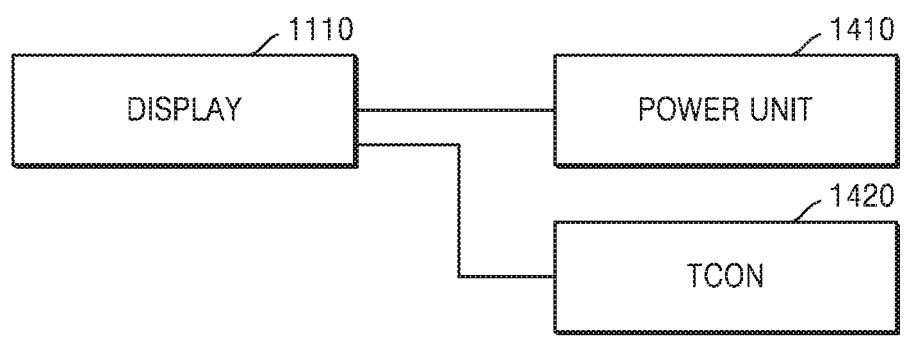
FIG. 14 illustrates an example of a structure of a display apparatus, according to an embodiment of the disclosure.

FIG. 14 illustrates an example of a structure of a display apparatus 1100, according to an embodiment of the disclosure.

Referring to FIG. 14, the display apparatus 1100 according to an embodiment of the disclosure may include a timing controller (TCON) 1420 and a power unit 1410. The TCON 1420 may be included in the processor 1120 of the display apparatus 1100.

The power unit 1410 according to an embodiment of the disclosure may be an internal power supply of the display apparatus 1100, or may supply power from an external power supply of the display apparatus 1100 to internal components of the display apparatus 1100. According to an embodiment of the disclosure, the power unit 1410 may supply power to controllers of the plurality of LED display modules included in the display 1110 included in the display apparatus 1100.

The TCON 1420 according to an embodiment of the disclosure may receive and process a low voltage differential signaling (LVDS) from a main board of the display apparatus 1100, and transmit, to the display 1110, an output signal including a clock signal, serial data of an image, and an address of each of the plurality of LED pixels included in the LED display modules included in the display 1110. An operation of driving an LED included in an LED display module may be performed according to a known method to one of ordinary skill in the art based on an input/output signal of the TCON 1420 and an output signal received by the display 1110 from the TCON 1420.

The TCON 1420 may include a memory storing the number of a plurality of LED display modules included in the display 1110, address information of the plurality of LED display modules, and shape information of the plurality of LED display modules. The TCON 1420 may control software that converts content, based on the information stored in the memory described above. The method of converting content based on the above-described information is described in detail with reference to FIG. 11.

Figure 15A:
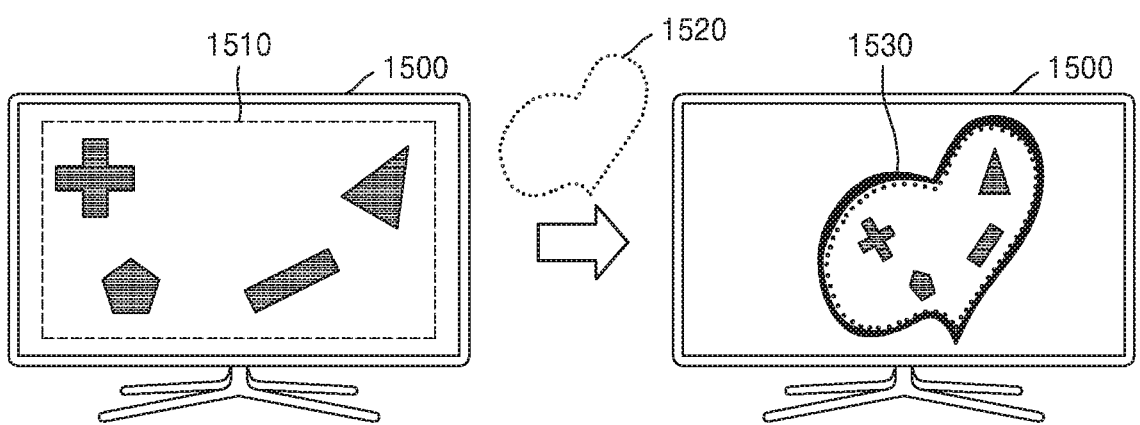
FIGS. 15A and 15B are diagrams for describing a content conversion method according to an embodiment of the disclosure.
Figure 15B:
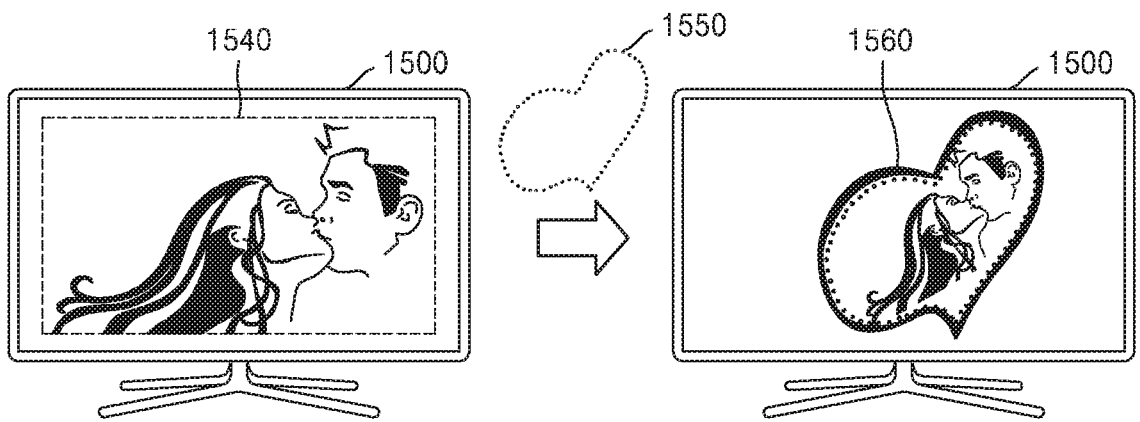

FIGS. 15A and 15B are diagrams for describing a content conversion method according to an embodiment of the disclosure.

Referring to FIGS. 15A and 15B, a display apparatus 1500 according to an embodiment of the disclosure may convert contents 1510 and 1540 being displayed, according to shapes 1520 and 1550 selected by a user and display contents 1530 and 1560 obtained by the conversion. According to an embodiment of the disclosure, the display apparatus 1500 may render content, standards and shapes of which are fixed, in various shapes. While conversion of a shape of displayed content according to an example is illustrated in FIGS. 15A and 15B, shapes to which content may be converted are not limited thereto. For example, the display apparatus 1500 may combine a plurality of pieces of content input to the display apparatus 1500 on one screen and display the same on a designated portion of the screen.

Figure 16:
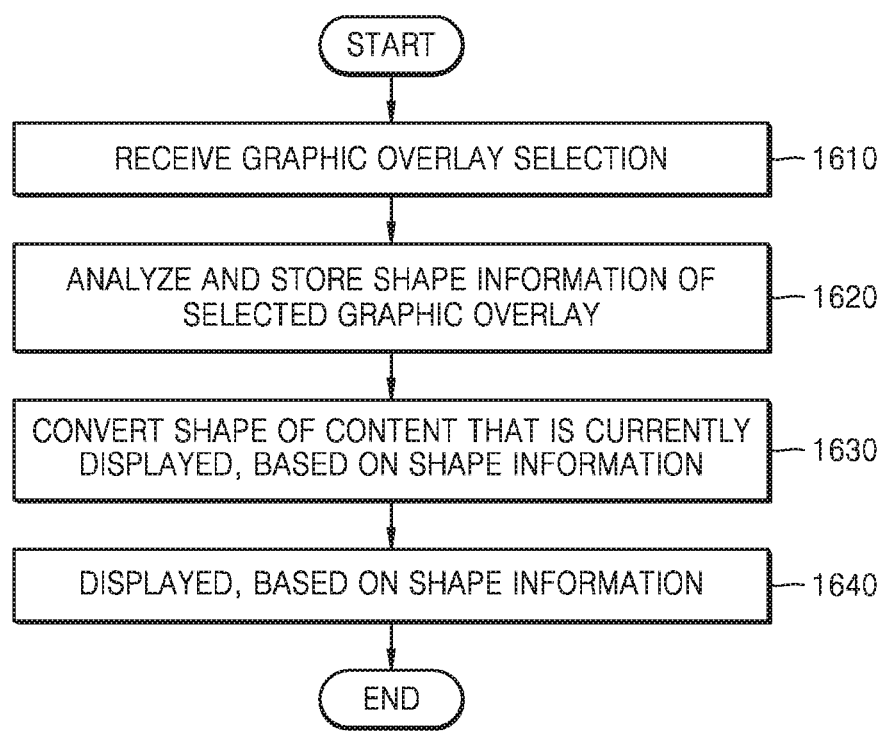
FIG. 16 is a flowchart of a content conversion method according to an embodiment of the disclosure.

FIG. 16 is a flowchart of a content conversion method according to an embodiment of the disclosure.

Referring to FIG. 16, the display apparatus 1500 according to an embodiment of the disclosure may receive a graphic overlay selection from a user (operation 1610). A graphic overlay refers to various shapes that a piece of content displayed after being converted may have. A graphic overlay will be described in detail with reference to FIG. 17.

Next, the display apparatus 1500 may analyze and store shape information of a selected graphic overlay (operation 1620). For example, the display apparatus 1500 may generate layout information used to content, based on shape information of the selected graphic overlay. According to an embodiment of the disclosure, the display apparatus 1500 may generate layout information of a grid shape, but the shape of layout information that may be generated is not limited to a grid shape. For example, the display apparatus 1500 may also generate layout information in units of a triangular shape or a hexagonal shape.

Next, the display apparatus 1500 may convert a shape of content that is currently being displayed, based on shape information (operation 1630). For example, the display apparatus 1500 may convert, based on the shape information of the graphic overlay, a shape of content that is currently displayed, to correspond to a shape of a selected graphic overlay by using linear transformation including at least one of rotation, reflection, scaling, shear, projection, cropping, or edge rounding.

Finally, the display apparatus 1500 may display the converted content (operation 1640).

Figure 17:
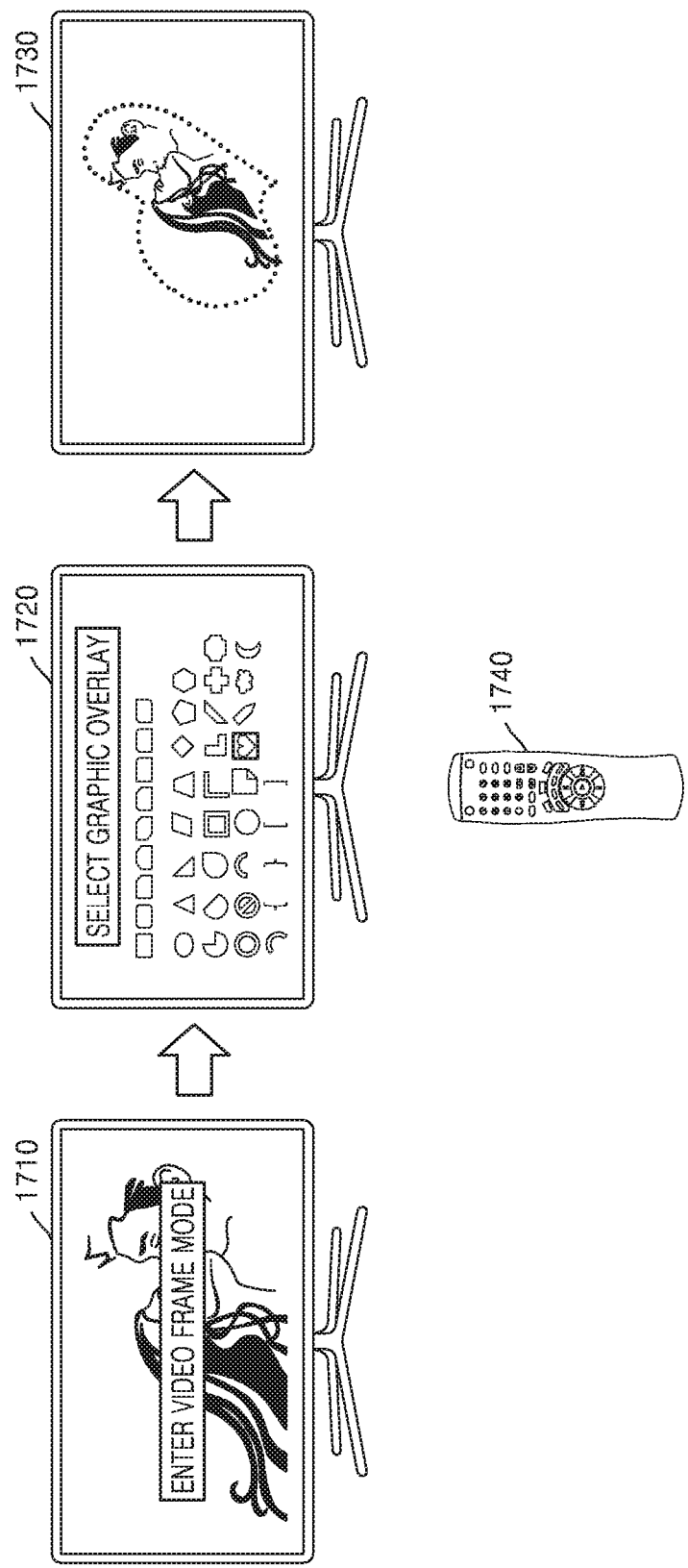
FIG. 17 is a diagram for describing a method of converting content based on a user input, according to an embodiment of the disclosure.

FIG. 17 is a diagram for describing a method of converting content based on a user input, according to an embodiment of the disclosure.

Referring to FIG. 17, a display apparatus 1500 according to an embodiment of the disclosure may receive an input for entering a video frame mode from a user in operation 1710. The above-described input may be received, for example, by a remote control 1740, but may also be received by a touch input or received from another control device. In operation 1720, the display apparatus 1500 may provide a video frame mode in which a shape of content being reproduced may be changed according to user's selection. The display apparatus 1500 may provide a user interface (UI) via which a graphic overlay of a previously stored, particular shape, is provided to a user in a video frame mode, and a selection regarding the graphic overlay of a particular shape is received from the user. The graphic overlay may include various shapes such as rectangles, triangles, circles, and arrows. Unlike the above-described embodiment of the disclosure, the display apparatus 1500 may receive a graphic overlay that is drawn by a user in a video frame mode, as a selection regarding a graphic overlay.

In operation 1730, the display apparatus 1500 may convert a shape of content that is being currently displayed, based on shape information, and display the content in the converted shape. FIG. 17 illustrates content that is displayed by converting content to correspond to a shape of a graphic overlay having a heart shape selected by a user.

The operating method of a display apparatus according to an embodiment of the disclosure can be implemented as program instructions that can be executed using various computer components and can be written to a computer readable recording medium. The computer readable recording medium may include program instructions, a data file, a data structure etc. alone or in combination. The program instructions written to the computer readable recording medium may be specifically designed and configured for the embodiments of the disclosure or may be well-known and available to one of ordinary skill in the art. Examples of the computer readable recording medium include magnetic media (e.g., hard disks, floppy disks, magnetic tapes, etc.), optical media (e.g., CD-ROMs, or DVDs), magneto-optical media (e.g., floptical disks), and hardware devices specifically configured to store and execute program instructions (e.g., ROM, RAM, flash memories, etc.). Examples of the program instructions include not only machine codes generated by using a compiler but also high-level language codes that can be executed on a computer by using an interpreter or the like.

Also, the operating method of a display apparatus according to the embodiments of the disclosure may be included in a computer program product to be provided. The computer program product may be traded as a product between a seller and a buyer.

The computer program product may include a software program and a computer-readable storage medium storing a software program. For example, the computer program product may include a product (e.g., a downloadable application) that is electronically distributed as a software program through an electronic market (e.g., Google Play Store or AppStore) or a manufacturer of an electronic device. For electronic distribution, at least a part of the software program may be stored in a storage medium or may be temporarily generated. In this case, the storage medium may be a server of the manufacturer, a server of the electronic market, or a storage medium of a relay server that temporarily stores the software program.

The computer program product may include a storage medium of a server or a storage medium of a client apparatus in a system including the server and the client apparatus. Alternatively, when a third apparatus (e.g., a smartphone) communicating with the server or the client apparatus exists, the computer program product may include a storage medium of the third apparatus. Alternatively, the computer program product may include a software program itself transmitted from the server to the client apparatus or the third terminal or from the third apparatus to the client apparatus.

In this case, one from among the server, the client apparatus, and the third apparatus may execute the computer program product and may perform the method according to the embodiments of the disclosure. Alternatively, two or more from among the server, the client apparatus, and the third apparatus may execute the computer program product and may execute the method according to the embodiments of the disclosure.

For example, a server (e.g., a cloud server or an artificial intelligence server, etc.) may execute a computer program product stored (or installed) on a server to control the client device communicating with the server to perform the method according to the disclosed embodiments.

While one or more embodiments have been described with reference to the figures, the scope of the disclosure of the disclosure is not limited thereto, and it will be understood by those of ordinary skill in the art that various changes in form and details may be made therein without departing from the spirit and scope as defined by the following claims.

What is claimed is:

1. A display apparatus comprising:
   a display comprising a plurality of light-emitting diode (LED) display modules, wherein each of the plurality of LED display modules comprises a plurality of LED pixels; and
   a controller configured to control operation of each of the plurality of LED pixels,
   wherein each of the plurality of LED pixels is connected to the controller via a different driving signal line, and at least two of the plurality of LED pixels are connected to the controller via a same power line,
   wherein the display is manufactured by:
   receiving form information of the display via user interface, the form information including any one or any combination of shape information of the display, size information of the display, and pixel pitch information of the display,
   generating layout information for generating the display of a specific shape based on the form information;
   determining, based on the layout information, the number of the plurality of LED display modules needed to generate the display of the specific shape, address information indicating a position of each of the plurality of LED display modules to generate the display of the specific shape, and shape information of each of the plurality of LED display modules;
   individually processing each of the plurality of LED display modules based on the address information and the shape information of each LED display module; and
   assembling the plurality of individually processed LED display modules in a position corresponding to each address information of each LED display module to form the display of the specific shape,
   wherein, the individually processing each of the plurality of LED display modules comprises cutting at least one LED display module among the plurality of LED display modules into a shape according to the shape information of each of the LED module.

2. The display apparatus of claim 1, wherein the controller is located in a central area of each LED display module, the controller comprising:
   a power unit; and
   an LED driver,
   wherein each of the plurality of LED pixels is connected to the LED driver via the different driving signal line, and the at least two of the plurality of LED pixels are connected to the power unit via the same power line.

3. The display apparatus of claim 1, wherein at least one LED display module among the plurality of LED display modules further comprises either or both of an insulator and an insulating coating.

4. The display apparatus of claim 1, wherein each of the plurality of LED display modules is individually manufactured and combined.

5. The display apparatus of claim 1, wherein each of the plurality of LED display modules is processed to have a respective shape to form the display of the specific shape.

6. A method of manufacturing a display apparatus comprising a display comprising a plurality of light-emitting diode (LED) display modules, the method comprising:
   receiving form information of the display via user interface, the form information including any one or any combination of shape information of the display, size information of the display, and pixel pitch information of the display;
   generating layout information for generating the display of a specific shape based on the form information;
   determining, based on the layout information, the number of the plurality of LED display modules needed to generate the display of the specific shape, address information indicating a position of each of the plurality of LED display modules to generate the display of the specific shape, and shape information of each of the plurality of LED display modules;
   individually processing each of the plurality of LED display modules based on the address information and the shape information of each LED display module; and
   assembling the plurality of individually processed LED display modules in a position corresponding to each address information of each LED display module to form the display of the specific shape,
   wherein, the individually processing each of the plurality of LED display modules comprises cutting at least one LED display module among the plurality of LED display modules into a shape according to the shape information of each of the LED module, wherein each of the plurality of LED display modules comprises:
   a plurality of LED pixels; and
   a controller configured to control operation of each of the plurality of LED pixels, and
   wherein each of the plurality of LED pixels is connected to the controller via a
   different driving signal line, and at least two of the plurality of LED pixels are connected to the controller via a same power line.

7. The method of claim 6, wherein the processing of each of the plurality of LED display modules based on the processing information comprises insulating each of the plurality of LED display modules in accordance with the form information of each of the plurality of LED display modules.

* * * * *